(12) United States Patent
Motz

(10) Patent No.: US 9,488,700 B2
(45) Date of Patent: Nov. 8, 2016

(54) MAGNETIC FIELD SENSORS AND SYSTEMS WITH SENSOR CIRCUIT PORTIONS HAVING DIFFERENT BIAS VOLTAGES AND FREQUENCY RANGES

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 527 days.

(21) Appl. No.: 14/025,115

(22) Filed: Sep. 12, 2013

(65) Prior Publication Data
US 2015/0070008 A1 Mar. 12, 2015

(51) Int. Cl.
*G01R 33/07* (2006.01)
*G01R 33/09* (2006.01)
*G01R 33/00* (2006.01)
*G01R 33/06* (2006.01)

(52) U.S. Cl.
CPC ........... *G01R 33/07* (2013.01); *G01R 33/0029* (2013.01); *G01R 33/06* (2013.01); *G01R 33/095* (2013.01)

(58) Field of Classification Search
CPC G01R 33/07; G01R 33/095; G01R 33/0029; G01R 33/06
See application file for complete search history.

(56) References Cited

U.S. PATENT DOCUMENTS

| 4,945,306 A * | 7/1990 | Lowther | G01N 27/82 324/220 |
|---|---|---|---|
| 5,304,926 A * | 4/1994 | Wu | G01D 5/147 324/207.2 |
| 7,859,259 B2 * | 12/2010 | Heiland | G01R 33/02 324/244 |
| 8,749,227 B2 | 6/2014 | Thomas et al. | |
| 2009/0001965 A1 * | 1/2009 | Ausserlechner | G01D 5/145 324/202 |
| 2010/0097088 A1 | 4/2010 | Uemura | |
| 2011/0215955 A1 * | 9/2011 | Motz | H03M 1/02 341/110 |

(Continued)

FOREIGN PATENT DOCUMENTS

DE 10062292 A1 * 3/2002 ............. G01R 33/07

OTHER PUBLICATIONS

English translation of DE 10062292 A, Mar. 7, 2002, Ausserlechner Udo.*

(Continued)

*Primary Examiner* — Jermele M Hollington
*Assistant Examiner* — Suresh K Rajaputra
(74) *Attorney, Agent, or Firm* — Schiff Hardin LLP

(57) ABSTRACT

Embodiments relate to Hall effect sensor circuits and devices that provide improved performance, such as reduced residual offset errors and/or improved S/N ratios. In an embodiment, a Hall effect sensor circuit comprises two circuit portions, a first with a higher bandwidth for higher frequencies and having an improved S/N ratio, and a second with a lower bandwidth for lower frequencies and having low residual offset. First and second Hall plates or devices are incorporated in the first and second circuit portions. The first Hall plate can be operated with a larger bias voltage and a larger, high-pass-filtered signal bandwidth, while the second Hall plate can be operated with a smaller bias voltage and a smaller, low-pass-filtered signal bandwidth. Individual output signals from each of the first and second Hall plates can be scaled and combined to provide an overall output signal with the benefits of each circuit portion, including reduced residual offset error and negligible increased noise.

20 Claims, 7 Drawing Sheets

(56) References Cited

U.S. PATENT DOCUMENTS

| | | |
|---|---|---|
| 2012/0016623 A1 | 1/2012 | Hayner |
| 2012/0074972 A1 | 3/2012 | Rasbornig et al. |
| 2012/0249170 A1 | 10/2012 | Baumann et al. |
| 2012/0262196 A1 | 10/2012 | Yokou |
| 2013/0049780 A1 | 2/2013 | Collins, III et al. |
| 2013/0076383 A1 | 3/2013 | Poinstingl et al. |
| 2013/0200909 A1 | 8/2013 | Rasbornig et al. |
| 2013/0293221 A1 | 11/2013 | Mialtu et al. |
| 2013/0314075 A1 | 11/2013 | Ausserlechner et al. |
| 2013/0342194 A1 | 12/2013 | Motz et al. |

OTHER PUBLICATIONS

Application and File History for U.S. Appl. No. 12/889,749, filed Sep. 24, 2010, inventors Rasbornig et al.

Application and File History for U.S. Appl. No. 13/833,852, filed Mar. 15, 2013, inventors Rasbornig et al.

Motz, et al. "A miniature digital current sensor with differential Hall probes using enhanced chopping techniques and mechanical stress compensation". IEEE Sensors Conference 2012, pp. 1-4.

\* cited by examiner

MAGNETIC FIELD SENSORS AND SYSTEMS WITH SENSOR CIRCUIT PORTIONS HAVING DIFFERENT BIAS VOLTAGES AND FREQUENCY RANGES

TECHNICAL FIELD

The invention relates generally to magnetic field sensors and more particularly to magnetic field sensors with multiple sensor circuit portions having different bias voltages and frequency ranges to provide low residual offset error while also having low noise and high bandwidth.

BACKGROUND

At its most basic, a Hall effect sensor is a magnetic field sensor which provides an output voltage related to a sensed magnetic field. Linear Hall effect sensors, for example, provide a linear relationship between an output voltage and a characteristic of an applied magnetic field and can include ordinary Hall plates as well as vertical Hall effect devices.

In many Hall effect sensor applications, e.g., differential sensing, desired sensor characteristics include low residual offset error (e.g., a non-zero output signal when there is zero applied magnetic field), low signal-to-noise (S/N) ratio and high bandwidth. To reduce or eliminate residual offset error, Hall effect sensors often are operated using spinning current schemes or techniques in which use of sensor contacts as output signal contacts, voltage or current supply contacts, and/or ground contacts is switched during different operating phases of the sensor, and the output signals from each operating phase are later combined.

Residual offset errors can relate to the voltage applied to the Hall effect sensor; for example, a higher voltage applied to a Hall plate can result in a higher residual offset error because of nonlinear effects (e.g., junction field effects from substrate potential to the Hall plate or thermo-dynamic effects). Thus, lower applied voltages can be preferred. At the same time, however, a high bias voltage can be necessary to improve the S/N ratio because the S/N ratio increases proportional to the bias voltage. Balancing these two characteristics often leads to compromise in the design of Hall effect sensor devices and circuits, such that neither the residual offset error or the S/N ratio is particularly poor. Of course, this results in neither being particularly good either. For example, one conventional approach in Hall effect sensor devices uses a fixed bias voltage optimized for noise. Still other approaches modulate the bias voltage or use stacked or similar Hall plate configurations. While these approaches can offer improvements, they still operate as compromises, leaving room for improvement in the design and operation of Hall effect sensor circuits and devices.

SUMMARY

Embodiments relate to magnetic field sensors, including Hall effect, magnetoresistive and other types. In an embodiment, a magnetic field sensor comprises a first magnetic field sensor element configured for a first bias voltage and coupled to first filter circuitry to provide a first signal of a first bandwidth; a second magnetic field sensor element configured for a second bias voltage less than the first bias voltage and coupled to second filter circuitry to provide a second signal of a second bandwidth less than the first bandwidth; and circuitry configured to combine the first signal and the second signal to provide a magnetic field sensor output signal.

In an embodiment, a method comprises applying a first bias voltage to a first magnetic field sensor element; applying a second bias voltage to a second magnetic field sensor element, the second bias voltage being less than the first bias voltage; sensing a magnetic field by the first and second magnetic field sensor elements to obtain a first magnetic field sensor signal and a second magnetic field sensor signal; high-pass filtering the first magnetic field sensor signal to obtain a high-pass filtered magnetic field sensor signal; low-pass filtering the second magnetic field sensor signal to obtain a low-pass filtered magnetic field sensor signal; and combining the high-pass filtered magnetic field sensor signal and the low-pass filtered magnetic field sensor signal to obtain a magnetic field sensor output signal.

In an embodiment, a magnetic field sensor comprises a first magnetic field sensor element configured for a first bias voltage and coupled to a first switch having a first switching frequency; a second magnetic field sensor element configured for a second bias voltage less than the first bias voltage and coupled to a second switch having a second switching frequency less than the first switching frequency; circuitry configured to filter a signal from the first switch and a signal from the second switch and provide a combined signal related to the signal from the first switch and the signal from the second switch; and an amplifier receiving the signal from the first switch and the combined signal as inputs and providing a magnetic field sensor output signal.

BRIEF DESCRIPTION OF THE DRAWINGS

The invention may be more completely understood in consideration of the following detailed description of various embodiments of the invention in connection with the accompanying drawings, in which.

Figure 1:
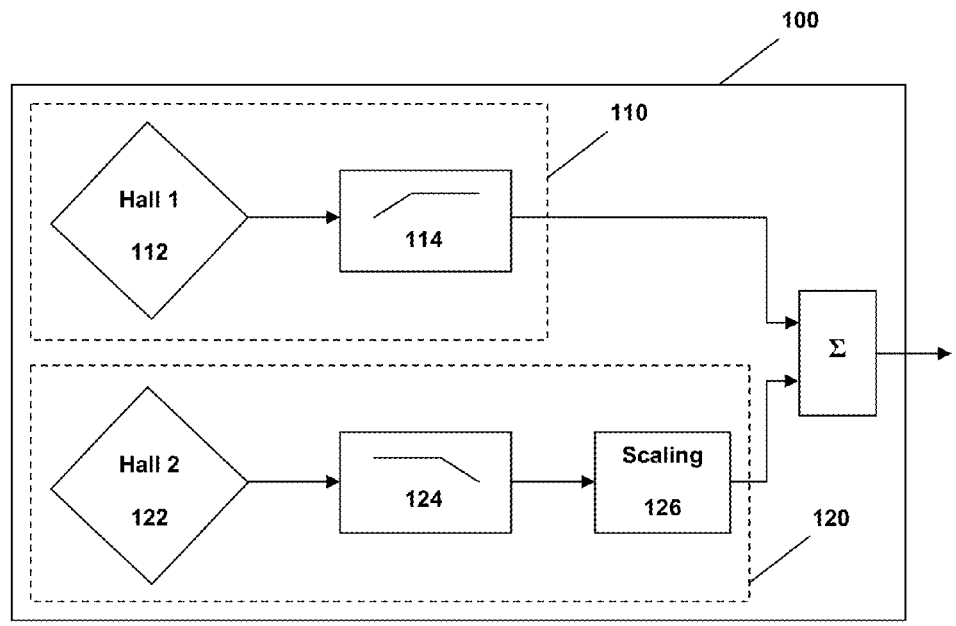
FIG. 1 is a block diagram of a magnetic field sensor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to Hall effect sensor circuits and devices that provide improved performance, such as reduced residual offset errors and/or improved S/N ratios. In an embodiment, a Hall effect sensor circuit comprises two circuit portions, a first with a higher bandwidth for higher frequencies and having an improved S/N ratio, and a second with a lower bandwidth for lower frequencies and having low residual offset. First and second Hall plates or devices are incorporated in the first and second circuit portions. The first Hall plate can be operated with a larger bias voltage and a larger, high-pass-filtered signal bandwidth, while the second Hall plate can be operated with a smaller bias voltage and a smaller, low-pass-filtered signal bandwidth. Individual output signals from each of the first and second Hall plates can be scaled and combined to provide an overall output signal with the benefits of each circuit portion, including reduced residual offset error and negligible increased noise.

Referring to FIG. 1, a conceptual block diagram of a Hall effect sensor device 100 is depicted. Device 100 comprises a first circuit portion 110 and a second circuit portion 120. In embodiments, first and second circuit portions 110 and 120 are arranged on the same substrate or board and/or otherwise arranged together in a single package, though this can vary in other embodiments. First circuit portion 110 comprises a first Hall effect element 112, and second circuit portion 120 comprises a second Hall effect element 122. Hall effect elements 112 and 122 each can comprise one or more Hall plates or probes, vertical Hall elements or other Hall effect sensor elements, and can be the same or different from one another, in embodiments. As will be discussed herein below, bias voltages applied to first and second Hall effect elements 112 and 122 can be different in embodiments, and the respective signal bandwidths also can vary, such that in one embodiment a Hall plate with a high sensitivity (i.e., a lower doping value) can be used with a higher bias voltage and higher bandwidth, high-pass filtered signal, along with a Hall plate with a lower bias voltage and lower bandwidth for a low residual offset (i.e., higher doping value). In other embodiments, other magnetic field sensor elements can be used, including magnetoresistive (XMR) or another suitable sensor element responsive to magnetic fields or effects. An example embodiment comprising ordinary Hall plates generally will be discussed herein throughout but is not to be considered limiting with respect to other embodiments and/or the claims.

First circuit portion 110 also comprises high-pass filter circuitry 114. Second circuit portion 120 comprises low-pass filter circuitry 124 and scaling circuitry 126. Other circuitry and circuit elements can be included in device 100, such as between first Hall effect element 112 and high-pass filter circuitry 114, and/or between second Hall effect element 122 and low-pass filter circuitry 124. Moreover, high-pass filter circuitry 114 and low-pass filter circuitry 124 can be interchanged in embodiments, with scaling circuitry 126 arranged accordingly.

Figure 2:
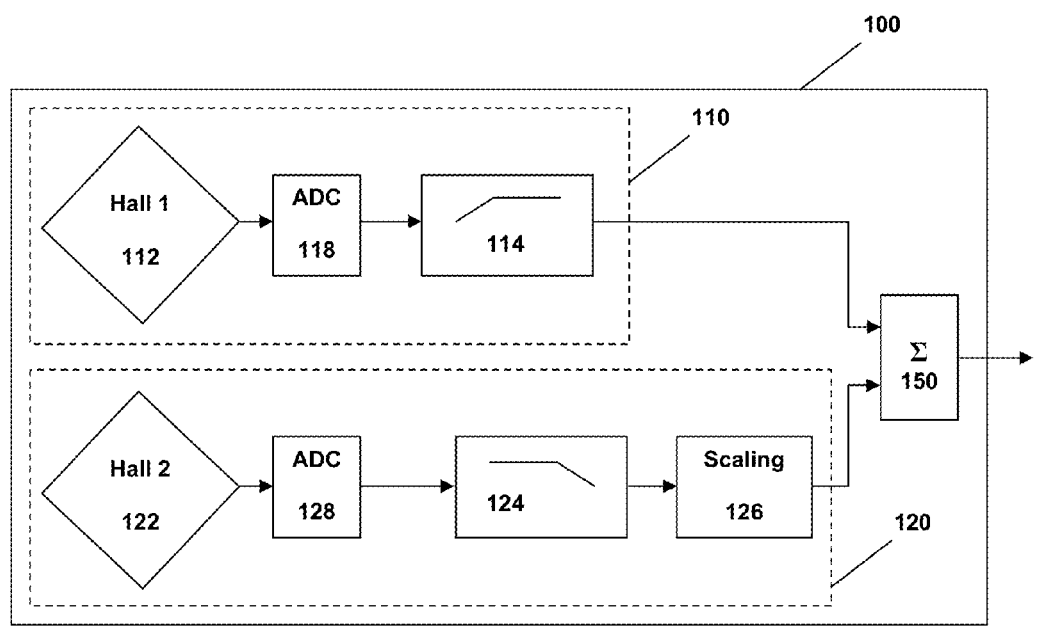
FIG. 2 is a block diagram of a magnetic field sensor according to an embodiment.

For example, in FIG. 2 device 100 further comprises analog-to-digital converters (ADCs) 118 and 128 between first Hall effect element 112 and high-pass filter circuitry 114, and second Hall effect element 122 and low-pass filter circuitry 124, respectively. Digital summing circuitry 150 combines the signals of first and second circuit portions 110 and 120 in embodiments and can provide a highly accurate matching between the time constants of high-pass filter circuitry 114 and low-pass circuitry 124, thus providing a highly accurate, flat amplitude and/or delayed-response output signal over the frequency range in embodiments. Other signal conversion and/or processing circuitry can be included in embodiments, as appropriate and as appreciated by those skilled in the art.

Figure 3:
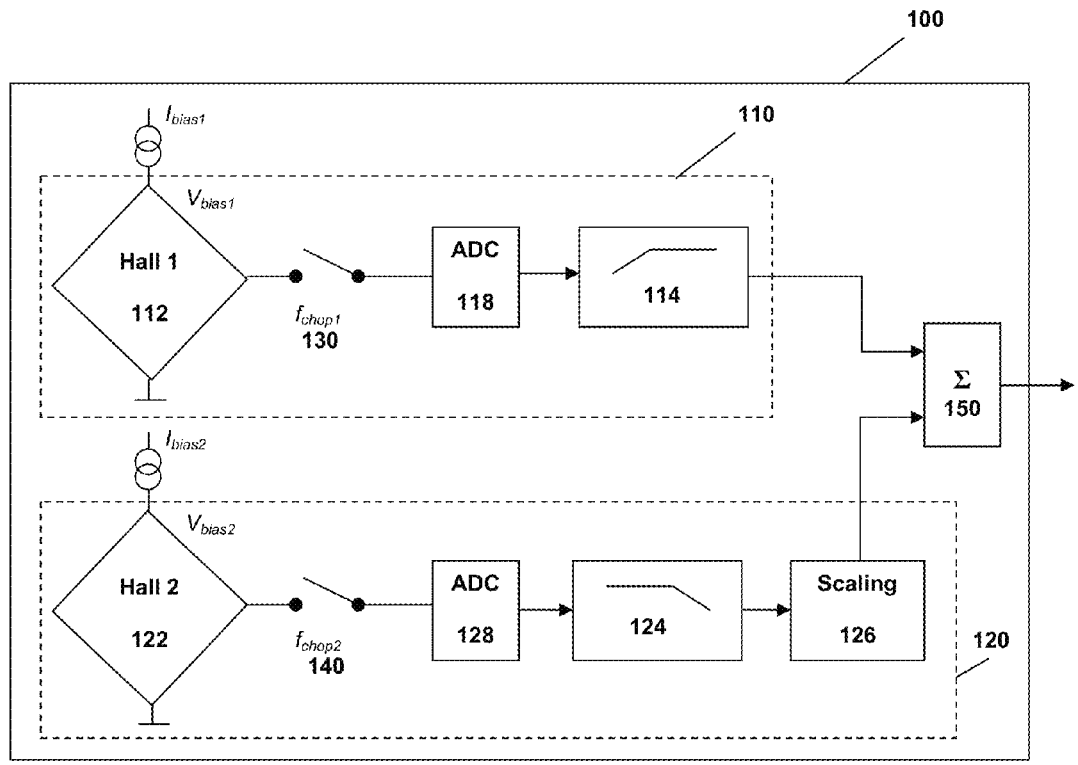
FIG. 3 is a block diagram of a magnetic field sensor according to an embodiment.

Referring to FIG. 3, device 100 can further comprise switches 130 and 140 in embodiments, such that output signals from first and second Hall effect elements 112 and 122, respectively, can be switched or chopped, such as at a desired frequency, in embodiments. Thus, in operation of device 100, a current $I_{bias1}$ is injected into, or a voltage $V_{bias1}$ is applied to, first Hall effect element 112. A second current $I_{bias2}$ is injected into, or a voltage $V_{bias2}$ is applied to, second Hall effect element 122. The second current or voltage, i.e., the current or voltage associated with circuit portion 120 comprising low-pass filter circuitry 124, is relatively small compared with the first current or voltage, in embodiments. The currents or voltages can vary in embodiments, but in one example embodiment $V_{bias1}$ is about 2V and $V_{bias2}$ is about ¼ $V_{bias1}$, or 0.5 V. If currents are injected in embodiments, they can be adjusted or set accordingly.

In embodiments, output signals of the first and second Hall effect elements 112 and 122 then can be switched or chopped by switches 130 and 140, respectively. In one embodiment, the signal bandwidth of second Hall effect element 122 is less than the signal bandwidth of first Hall effect element 112, such that the chopper frequency $f_{chop2}$ of switch 140 coupled to second Hall effect element 122 can be lower than the chopper frequency $f_{chop1}$ of switch 130 coupled to first Hall effect element 112. For example, in an embodiment the signal bandwidth of first Hall effect element 112, which will be high-pass filtered, is about 78 Hz to about 10 kHz, while the signal bandwidth of second Hall effect element 122, which will be low-pass filtered, is about 0 Hz (or DC) to about 78 Hz, and $f_{chop2}$ is about 1/128 of $f_{chop1}$ (where the cutoff between high-pass filter circuitry 114 and low-pass filter circuitry 124, or 78 Hz, is equal to 10 kHz/128), though other bandwidths and frequencies can be used in other embodiments.

The chopped signals are then converted to digital signals by ADCs 118 and 128, respectively. The particular order and arrangement of circuit elements and functions discussed herein is merely an example of one embodiments and can vary in other embodiments.

The digital signals are then high-pass filtered (by high-pass filter circuitry 114) and low-pass filtered (by low-pass filter circuitry 124), respectively, though in other embodiments this filtering can be carried out before ADCs 118 and 128 and therefore not in the digital domain. As previously mentioned, in one embodiment the cutoff frequency for each circuitry 114 and 124 is 78 Hz, though this can vary in other embodiments.

The signal originating from second Hall effect element 112 is then scaled via scaling circuitry 126. In an embodiment, the signal is scaled by a ratio related to the bias voltages or currents, i.e., $V_{bias1}/V_{bias2}$ or $I_{bias1}/I_{bias2}$, which can be about a factor of 4 in an embodiment in which $V_{bias1}$ is about 2V and $V_{bias2}$ is about 0.5 V but can vary in other embodiments. As previously mentioned, first and second Hall effect elements 112 and 122 can be the same or different, and the scaling factor can take these differences into account. For example, a Hall probe with a higher doping concentration is less sensitive and consumes more current, but its residual offset error may be lower, e.g., because piezo, thermo-dynamic, modulation, junction field effects and/or other effects from substrate voltage decrease. Thus, scaling circuitry 126 can take into account different sensitivities, as well as other factors, between first and second Hall effect elements 112 and 122 in embodiments.

Then, the signals from first circuit portion 110 and second circuit portion 120 are combined by circuitry 150. In an embodiment, the signals are combined by summing or adding them, though other combination methodologies can be used in other embodiments.

Figure 4:
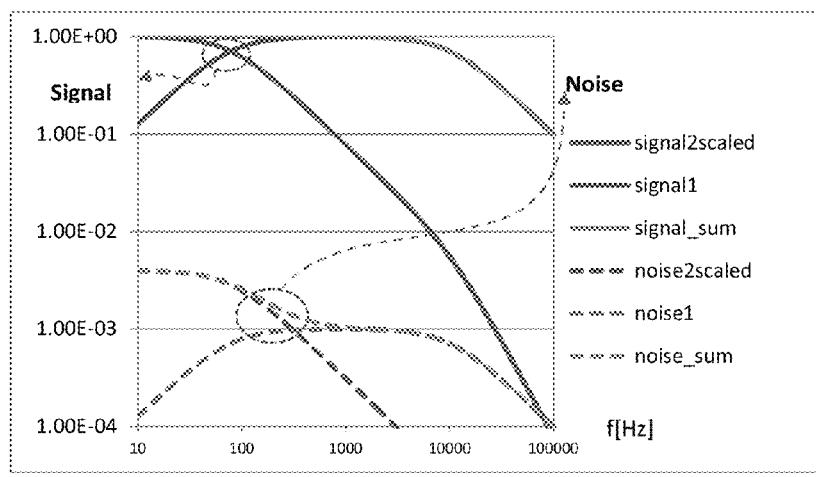
FIG. 4 is a graph of simulated signal bandwidths and noise levels according to an embodiment.

Referring also to FIG. 4, splitting the signal into two signal paths, a high-pass-filtered first circuit portion 110 and a low-pass-filtered second circuit portion 120, provides reduced residual offset error and improved S/N ratios. In FIG. 4, signal1 is the signal of first circuit portion 110 and signal2 scaled is the signal of second circuit portion 120. The combined signal at the output of circuitry 150 is signal-sum. As can be seen, signal_sum is flat up to about the desired upper bandwidth limit of 10 kHz, while the noise decreases in the same signal over the bandwidth, illustrated by noise_sum. Thus, the dual-Hall effect element configuration of FIG. 3 can provide an improved S/N ratio. At the same time, the residual offset error can be reduced to $1/16^{th}$ of its original value (i.e., $1/(2V/0.5V)^2$) because the nonlinear effects decrease according to the square law of the bias voltage, while the signal decreases linearly. This leads to a smaller residual offset error in signal portion 120, even after scaling circuitry 126. In other words, a higher desired bandwidth and improved S/N ratio can be obtained via first circuit portion 110 because of the increased bias voltage, while the signal of second circuit portion 120 reduces the residual offset when combined with the signal of first circuit portion 110. The noise density (i.e., in V/sqrt(Hz)) of signal portion 120 increases by the scaling factor applied by scaling circuitry 126, but the significantly decreased bandwidth of that signal portion 120 leads to only a negligible increased overall noise (i.e., in V) of system 100. Yet another benefit can be reduced dynamic errors caused by charge injection of chopper switches 130 and 140 by a ratio of $(f_{chop1}/f_{chop2})*(V_{bias2}/V_{bias1})$, which further reduces the residual offset error. In one example embodiment, these dynamic errors can be reduced by $(1/128)*(4/1)=1/32$, though these values can vary in other embodiments. These benefits can be balanced with an increased area required to accommodate both circuit portions, but this area is still much less (e.g., eight times less) than a conventional stacked solution. The current or voltage consumption also increases, but only slightly, e.g., by 25% in embodiments.

Figure 5:
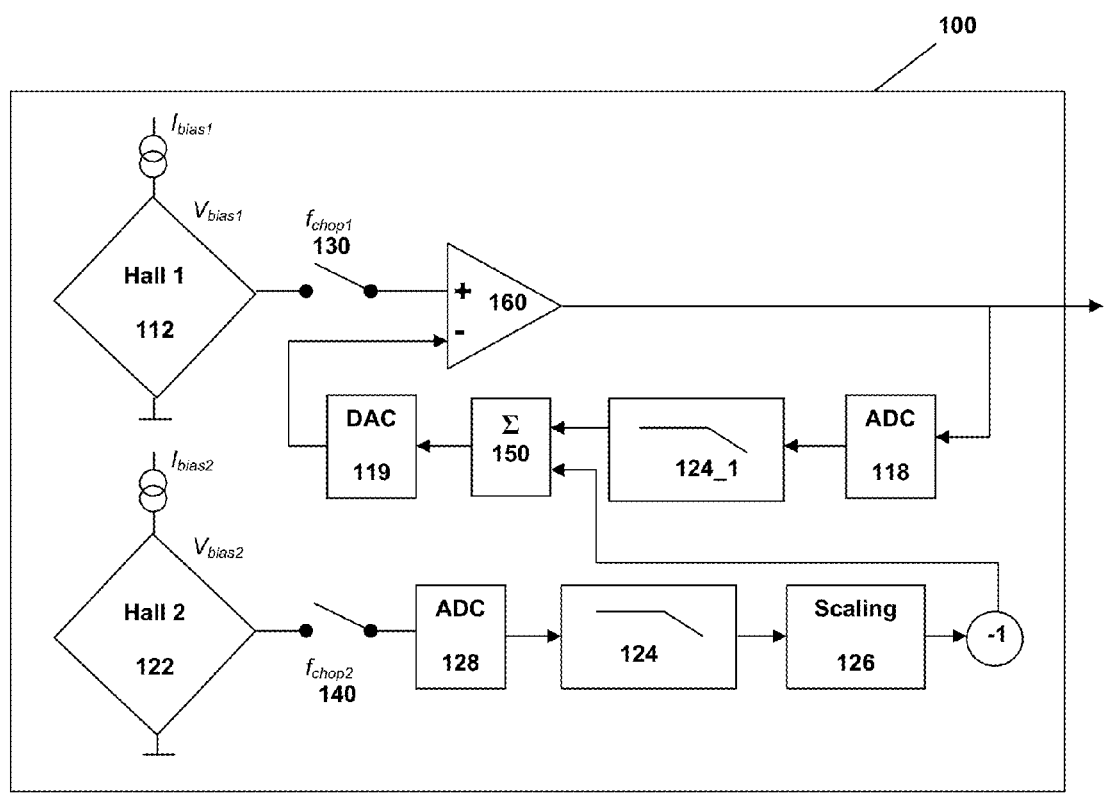
FIG. 5 is a block diagram of a magnetic field sensor according to an embodiment.

Additional embodiments are also possible. For example, in FIG. 5 device 100 provides an analog output, comprising a fast analog path from first Hall effect element 112 to the output, via switch 130 and amplifier 160. Such a configuration can be advantageous in, e.g., high frequency applications, such as those at or above 100 kHz. Other elements and operation of device 100 are largely the same as those of and for device 100 of FIG. 3 (particularly those having the same reference numerals) unless otherwise discussed herein, though in FIG. 5 device 100 comprises two low-pass filters 124, with filter 124_1 associated with the signal path of first Hall effect element 112. First Hall effect element 112 again is the primary magnetic field signal device, as in FIG. 3, though at low frequencies the signal of second Hall effect element 122 can be used instead of that of first Hall effect element 112. Device 100 of FIG. 5 also comprises a digital-to-analog converter (DAC) 119 to convert the summed signal back to analog before amplifier 160.

Figure 6:
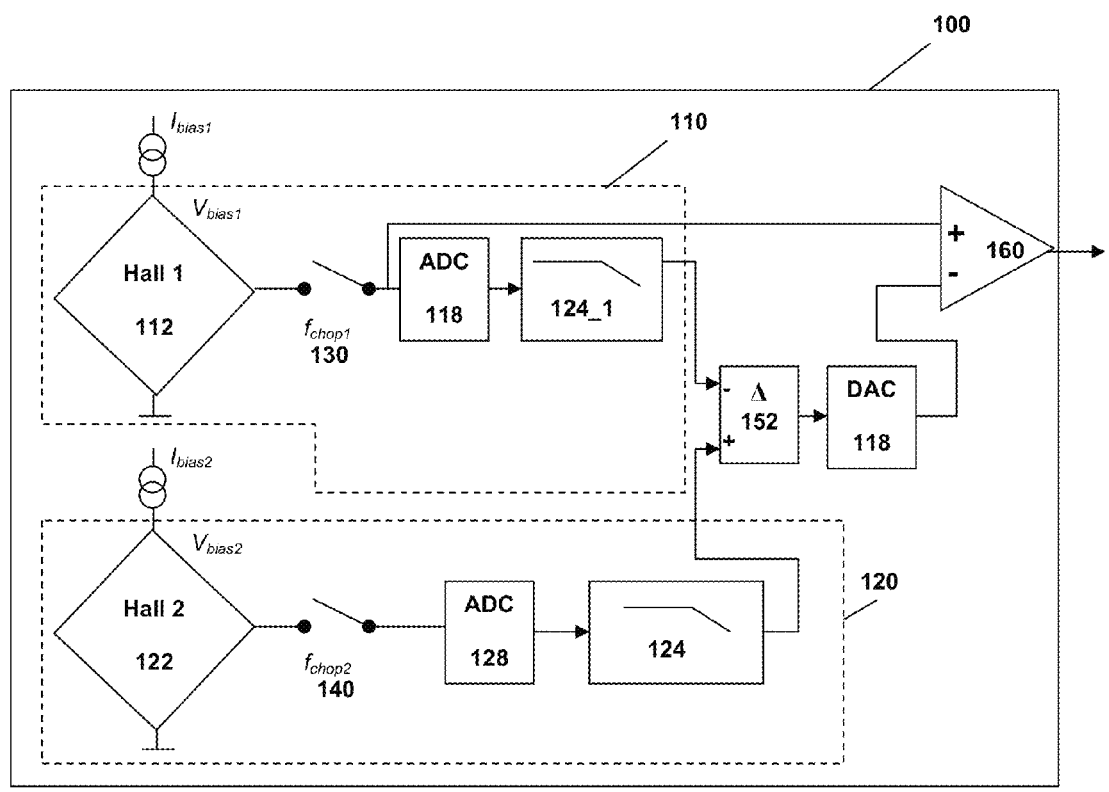
FIG. 6 is a block diagram of a magnetic field sensor according to an embodiment.

Another embodiment which can provide a fast analog output is depicted in FIG. 6. Here, a first signal path from first Hall effect element, via switch 130, provides an analog signal to amplifier 160. That analog signal is also converted to digital by ADC 118 and low-pass filtered by low-pass filter circuitry 124_1 before being provided to difference-determining circuitry 152, which determines a difference between the digitized signals of first and second Hall effect elements 112 and 122. The digitized difference signal is then converted back to analog by DAC 118 and provided to amplifier 160, which provides an analog output signal of device 100 based on the signal of first Hall effect element 112 and the difference signal of circuitry 152.

Figure 7:
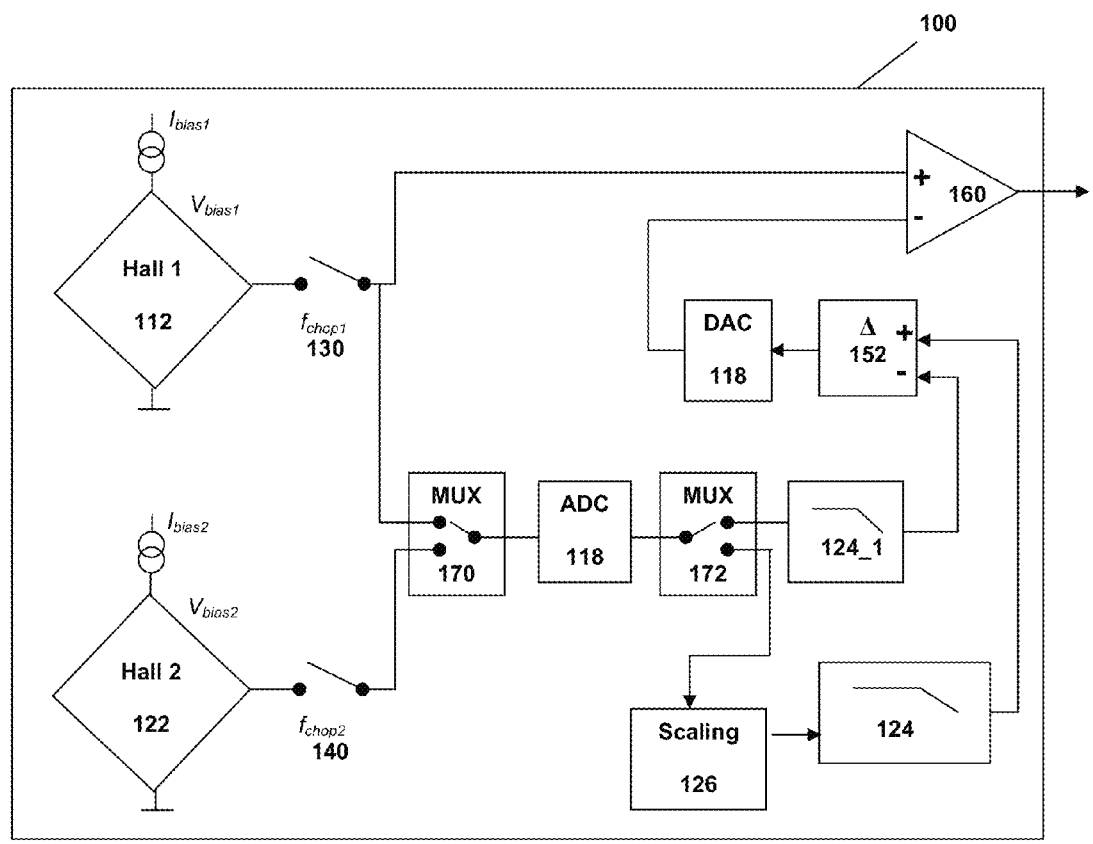
FIG. 7 is a block diagram of a magnetic field sensor according to an embodiment.

Still another analog-output embodiment is depicted in FIG. 7 and uses only a single ADC 118. A first multiplexer (MUX) 170 is used to multiplex the chopped signals from first and second Hall effect elements 112 and 122 via switches 130 and 140, respectively, to provides the multiplexed signals to ADC 118. ADC 118 then provides the digitized signal to a second MUX 172 which multiplexes the digitized signal between low-pass filter circuitry 124_1 and scaling circuitry 126, which in turn provides the scaled digitized signal to low-pass filter circuitry 124. The two low-pass filtered signals are then provided to difference circuitry 152, and similar to the embodiment of FIG. 6 the digitized difference signal is then converted back to analog by DAC 118 and provided to amplifier 160, which provides an analog output signal of device 100 based on the signal of first Hall effect element 112 and the difference signal of circuitry 152.

Figure 8:
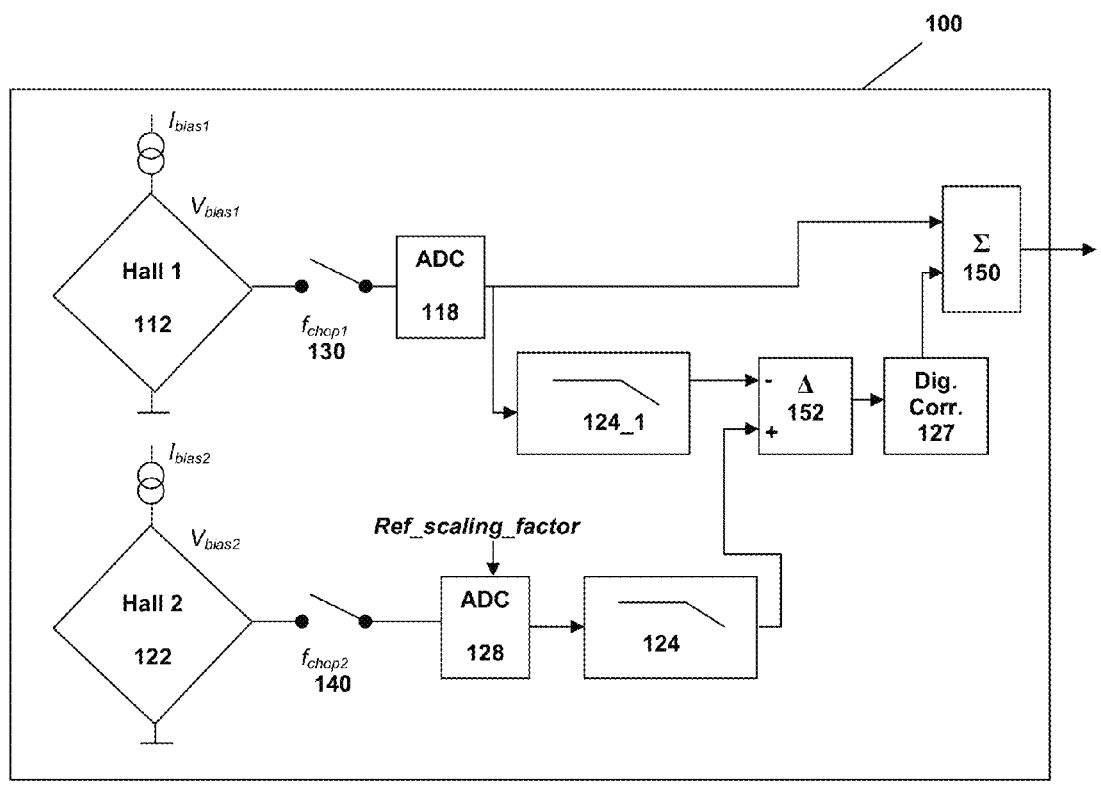
FIG. 8 is a block diagram of a magnetic field sensor according to an embodiment.

Another embodiment of device 100 is depicted in FIG. 8, in which a digital output is again provided (similar to the embodiment of FIG. 3). Similar to other embodiments, however, two low-pass filters 124_1 and 124 are again implemented, with the output of each provided to circuitry 152, which determines a difference between the signals to cancel the offset in the signal from first Hall effect element 112 by the signal from second Hall effect element 124. After circuitry 152, the difference signal is adjusted by a digital correction factor at circuitry 127, then combined with the digitized signal from first Hall effect element 112 by circuitry 150. The scaling factor applied to the signal from second Hall effect element 124 after digitization and filtering in other embodiments can be implemented here as part of the analog-to-digital conversion by ADC 128, where the scaling can also take into account a reference value to scale according to Ref_scaling_factor. Ref_scaling_factor can be a realization of the scaling factor that scales down the reference voltage of ADC 128 in embodiments. Thus, the digital output of ADC 128 is scaled up because the input signal is related to a scaled-down reference voltage. The Least Significant Bit (LSB) over V (LSB/V) increases because V is in the denominator of the transfer function of ADC 128. Other scaling factors and approaches can be used in other embodiments. In general, scaling factors also can include a percentage additional scaling to account for other factors, e.g., different Hall plate sensitivities caused by different doping factors.

Figure 9:
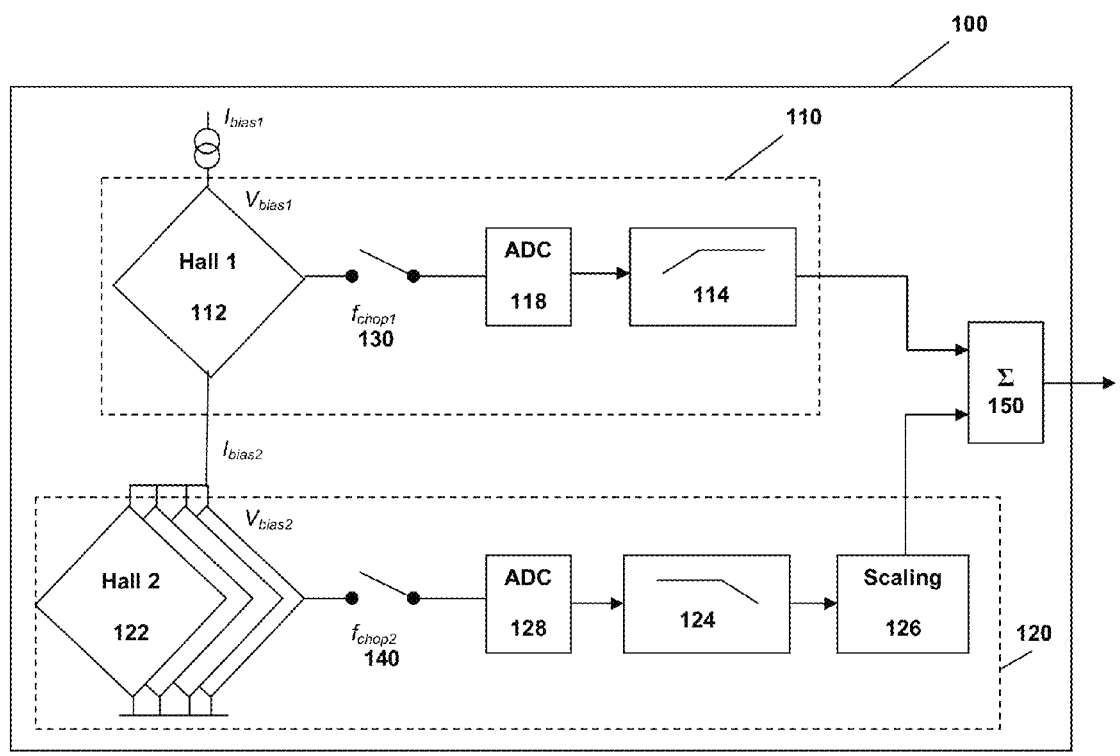
FIG. 9 is a block diagram of a magnetic field sensor according to an embodiment.

Yet another embodiment of device 100 is depicted in FIG. 9, which is similar to the embodiment of FIG. 3. In FIG. 9, however, a plurality of second Hall effect sensor elements 122 are implemented in a stacked configuration. Four stacked Hall effect sensor elements 122 are depicted in FIG. 9, but more or fewer can be implemented in various embodiments. The plurality of second Hall effect sensor elements 122 are coupled with one another in parallel, and then the stack is coupled in series with first Hall effect element 112. An advantage of the embodiment of device 100 of FIG. 9 can be more effective current consumption, while also providing other advantages discussed herein.

Still other embodiments also are possible. For example, in an embodiment first Hall effect element 112 instead comprises a magnetoresistive (XMR) sensor, to which the higher bias voltage is applied and the signal from which has a higher bandwidth and is high-pass filtered, and second Hall effect element 122 comprises a vertical or other Hall effect element, to which the lower bias voltage is applied and the signal from which has a lower bandwidth. An advantage of such an embodiment is that the XMR sensor can provide a much higher S/N ratio compared with a Hall plate at the same bias voltage.

Numerous other embodiments and configurations also are possible, in addition to the examples embodiments depicted and/or discussed herein. Advantages of these and other embodiments include a first Hall effect element having a first bias voltage and output signal chopped at a first frequency to reduce flicker noise, associated with a first signal path which is high-pass filtered to provide a higher frequency signal with lower white noise, and a second Hall effect element having a second bias voltage smaller than the first bias voltage and an output signal chopped at a second frequency lower than the first frequency to reduce dynamic offset effects caused by switching, associated with a second signal path which is low-pass filtered to provide a lower frequency signal with lower residual offset error. The higher frequency signal and the lower frequency signal then can be combined and provided as a digital output signal having an improved S/N ratio, higher bandwidth and reduced residual offset error when compared with at least one conventional approach. While noise may be slightly increased overall in some embodiments, it can be compensated for by the increased bias voltage which can be used, such that the overall S/N ratio can be improved without decreasing offset performance. Other embodiments are disclosed which can provide analog output signals, among other features, while also providing one or more of the aforementioned advantages and improvements.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetic field sensor comprising:
   a first magnetic field sensor element configured for a first bias voltage and coupled to first filter circuitry to provide a first signal of a first bandwidth;
   at least one second magnetic field sensor element configured for a second bias voltage less than the first bias voltage and coupled to second filter circuitry to provide a second signal of a second bandwidth less than the first circuitry configured to generate a combined signal based on the first signal and the second signal; and
   comparator circuitry configured to:
      compare the first signal from the first magnetic signal field sensor element and the combined signal; and
      generate a magnetic field sensor output signal based on the comparison of the first signal and the combined signal.

2. The magnetic field sensor of claim 1, wherein the first and at least one second magnetic field sensor elements are selected from the group consisting of: a Hall plate; a Hall probe; a vertical Hall effect element; and a magnetoresistive element.

3. The magnetic field sensor of claim 1, wherein the first filter circuitry comprises high-pass filter circuitry, and the second filter circuitry comprises low-pass filter circuitry.

4. The magnetic field sensor of claim 1, further comprising:
   a first switch coupled to the first magnetic field sensor element, the first switch having a first switching frequency; and
   a second switch coupled to the at least one second magnetic field sensor element, the second switch having a second switching frequency less than the first switching frequency.

5. The magnetic field sensor of claim 1, further comprising:
   a first analog-to-digital converter (ADC) coupled between the first magnetic field sensor element and the first filter circuitry; and
   a second ADC coupled between the at least one second magnetic field sensor element and the second filter circuitry.

6. The magnetic field sensor of claim 5, further comprising scaling circuitry coupled between the second ADC and the circuitry configured to combine the first signal and the second signal.

7. The magnetic field sensor of claim 6, wherein the scaling circuitry is configured to apply a scaling factor related to a ratio between the first bias voltage and the second bias voltage.

8. The magnetic field sensor of claim 1, wherein the first signal has a lower noise component than the second signal.

9. The magnetic field sensor of claim 1, wherein the second signal has a lower residual offset error than the first signal.

10. A method comprising:
applying a first bias voltage to a first magnetic field sensor element;
applying a second bias voltage to a second magnetic field sensor element, the second bias voltage being less than the first bias voltage;
sensing a magnetic field by the first and second magnetic field sensor elements to obtain a first magnetic field sensor signal and a second magnetic field sensor signal;
generating a first filtered magnetic field sensor signal based on the first magnetic field sensor signal;
generating a second filtered magnetic field sensor signal based on the second magnetic field sensor signal;
combining the first filtered magnetic field sensor signal and the second filtered magnetic field sensor signal to generate a combined signal; and
comparing the combined signal and the first magnetic field sensor signal to generate a magnetic field sensor output signal based on the comparison of the combined signal and the first magnetic field sensor signal.

11. The method of claim 10, further comprising scaling the second filtered magnetic field sensor signal before the combining.

12. The method of claim 11, wherein the combining comprises summing the first filtered magnetic field sensor signal and the scaled second filtered magnetic field sensor signal.

13. The method of claim 10, further comprising:
digitizing the first magnetic field sensor signal, wherein the first filtered magnetic field sensor signal is based on the digitized first magnetic field sensor signal; and
digitizing the second magnetic field sensor signal, wherein the second filtered magnetic field sensor signal is based on the digitized second magnetic field sensor signal.

14. The method of claim 13, further comprising chopping the first magnetic field sensor signal at a first frequency before the digitizing, and chopping the second magnetic field sensor signal at a second frequency less than the first frequency before the digitizing.

15. A magnetic field sensor comprising:
a first magnetic field sensor element configured for a first bias voltage and coupled to a first switch having a first switching frequency;
a second magnetic field sensor element configured for a second bias voltage less than the first bias voltage and coupled to a second switch having a second switching frequency less than the first switching frequency;
circuitry configured to:
generate a first filtered signal based on a signal from the first switch;
generate a second filtered signal based the second switch; and
generate a combined signal based on the first filtered signal and the second filtered signal; and
an amplifier configured to:
receive the signal from the first switch and the combined signal as inputs; and
generate a magnetic field sensor output signal based on the signal from the first switch and the combined signal.

16. The magnetic field sensor of claim 15, wherein the circuitry comprises at least one analog-to-digital converter (ADC) and at least one digital-to-analog converter (DAC).

17. The magnetic field sensor of claim 16, wherein the circuitry comprises at least one low-pass filter.

18. The magnetic field sensor of claim 15, wherein the magnetic field sensor output signal is an analog signal.

19. The magnetic field sensor of claim 15, wherein the signal from the first switch has a lower noise component than the signal from the second switch.

20. The magnetic field sensor of claim 15, wherein the signal from the first switch has a lower residual offset error than the signal from the second switch.

* * * * *